US012713917B2

(12) United States Patent
Karikalan et al.

(10) Patent No.: US 12,713,917 B2
(45) Date of Patent: Aug. 18, 2026

(54) MICROFLUIDIC CHANNELS FOR COOLING HYBRID BONDED INTERFACES

(71) Applicant: Avago Technologies International Sales Pte. Limited, Singapore (SG)

(72) Inventors: Sam Karikalan, Irvine, CA (US); Sam Zhao, Irvine, CA (US); Mayank Mayukh, Fort Collins, CO (US); Liming Tsau, Irvine, CA (US); Arun Ramakrishnan, Lake Forest, CA (US); Dharmendra Saraswat, Foothill Ranch, CA (US); Reza Sharifi, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 848 days.

(21) Appl. No.: 17/966,486

(22) Filed: Oct. 14, 2022

(65) Prior Publication Data

US 2024/0128156 A1 Apr. 18, 2024

(51) Int. Cl.

| | |
|---|---|
| ***H10W 40/47*** | (2026.01) |
| ***H10W 40/25*** | (2026.01) |
| ***H10W 40/43*** | (2026.01) |
| ***H10W 40/77*** | (2026.01) |
| ***H10W 74/01*** | (2026.01) |
| ***H10W 74/10*** | (2026.01) |

(Continued)

(52) U.S. Cl.

CPC ........... *H10W 40/47* (2026.01); *H10W 40/25* (2026.01); *H10W 40/43* (2026.01); *H10W 40/77* (2026.01); *H10W 74/01* (2026.01); *H10W 74/137* (2026.01); *H10W 72/951* (2026.01); *H10W 72/952* (2026.01); *H10W 80/312* (2026.01); *H10W 80/327* (2026.01); *H10W 90/792* (2026.01)

(58) Field of Classification Search

CPC ..... H01L 23/473; H01L 24/80; H01L 23/273; H01L 23/3171; H10W 40/47; H10W 40/77; H10W 74/137

See application file for complete search history.

(56) References Cited

U.S. PATENT DOCUMENTS 7,432,592 B2 10/2008 Shi et al.
8,299,563 B2 * 10/2012 Gambino .............. H01L 23/481 257/E29.02

(Continued)

FOREIGN PATENT DOCUMENTS

CN 111584448 A 8/2020
CN 111653488 A 9/2020

(Continued)

*Primary Examiner* — Dale E Page
*Assistant Examiner* — Wilner Jean Baptiste
(74) *Attorney, Agent, or Firm* — Quarles & Brady LLP

(57) ABSTRACT

A semiconductor device with a hybrid bonded interface having microfluidic channels is provided. The semiconductor device includes a first die comprising a first passivation layer, wherein the first passivation layer includes one or more first trenches, and a second die comprising a second passivation layer, wherein the second passivation layer includes one or more second trenches. The first die is bonded to the second die via hybrid copper-to-copper bonding, wherein the one or more first trenches and the one or more second trenches form one or more channels.

9 Claims, 7 Drawing Sheets

(51) Int. Cl.

| | |
|---|---|
| *H10W 72/90* | (2026.01) |
| *H10W 80/00* | (2026.01) |
| *H10W 90/00* | (2026.01) |

(56) References Cited

U.S. PATENT DOCUMENTS

| | | | | |
|---|---|---|---|---|
| 9,793,246 | B1 * | 10/2017 | Tseng | H10W 70/09 |
| 10,665,525 | B2 | 5/2020 | Teysseyre et al. | |
| 11,393,783 | B2 * | 7/2022 | Cheng | H10W 70/093 |
| 2007/0085198 | A1 * | 4/2007 | Shi | H10W 40/47<br>257/E23.098 |
| 2020/0035641 | A1 * | 1/2020 | Fountain, Jr. | H01L 25/0657 |

FOREIGN PATENT DOCUMENTS

| | | | |
|---|---|---|---|
| CN | 112349664 | A | 2/2021 |
| CN | 112838011 | B | 8/2021 |
| TW | I652773 | B | 3/2019 |

* cited by examiner

705 Form copper interconnect(s) on semiconductor die

710 Form dielectric passivation layer

715 Reveal copper interconnect(s)

720 Form trenches in dielectric passivation layer

725 Form channels via hybrid bonding a second die

730 Couple fluid interface to reservoir

735 Fill channel with heat transfer material

MICROFLUIDIC CHANNELS FOR COOLING HYBRID BONDED INTERFACES

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The present disclosure relates, in general, to methods, systems, and apparatuses for semiconductor devices with hybrid bonded interfaces.

BACKGROUND

Heat in hybrid copper-to-copper (Cu—Cu) bonded interfaces (referred to interchangeably as "hybrid bonded interfaces") can become problematic as two layers of active devices are placed together. In conventional hybrid Cu—Cu bonded interfaces, removal of heat from the hybrid Cu—Cu bonded interface is not typically possible as the copper (Cu) layers are bonded together without room or access for materials to carry away heat from the hybrid bonded interface.

Thus, methods, systems, and apparatuses for semiconductor devices with hybrid bonded interfaces having microfluidic channels are provided.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF EMBODIMENTS

Figure 1:
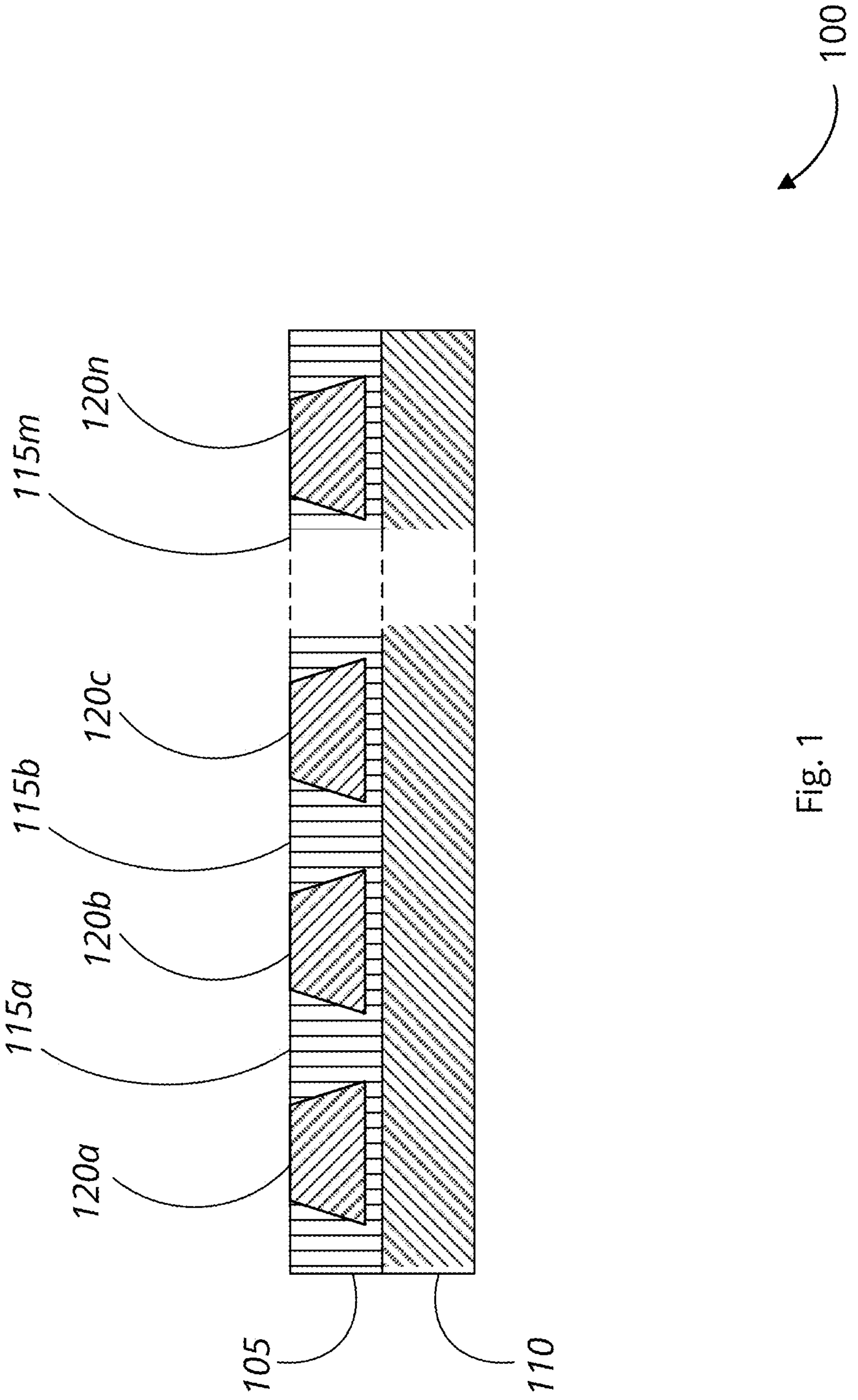
FIG. 1 is a schematic diagram of a cross-section of a die with a passivation layer and interconnects, in accordance with various embodiments.

Various embodiments set forth a die and semiconductor device with channels formed at a hybrid Cu—Cu bonded interface, and methods of manufacturing a semiconductor device with channels formed at a hybrid Cu—Cu bonded interface.

In some embodiments, an apparatus with channels at a hybrid Cu—Cu bonded interface is provided. The apparatus includes a die comprising an active device, one or more interconnects coupled to the active device, and a passivation layer formed over the one or more interconnects. At least part of the one or more interconnects is exposed through the passivation layer such that the passivation layer is disposed in areas between adjacent interconnects of the one or more interconnects. The passivation layer includes one or more trenches, each trench of the one or more trenches respectively formed adjacent to at least one of the at least part of each of the one or more interconnects that are exposed.

In further embodiments, a semiconductor device with channels formed at a hybrid Cu—Cu bonded interface is provided. The semiconductor device includes a first die comprising a first bonding interface. The first bonding interface comprises one or more first interconnects, and a first passivation layer. The first passivation layer includes one or more first trenches. The semiconductor device further includes a second die comprising a second bonding interface. The second bonding interface includes one or more second interconnects, and a second passivation layer. The second passivation layer includes one or more second trenches. The first die is bonded to the second die, wherein the first bonding interface is bonded to the second bonding interface via hybrid copper-to-copper bonding. The first and second bonding interfaces are arranged to form one or more channels at a hybrid bonded interface between the first bonding interface and the second bonding interface. A respective first trench of the one or more first trenches of the first bonding interface and a respective second trench of the one or more second trenches of the second bonding interface may define a respective channel of the one or more channels.

In further embodiments, a method of manufacturing a semiconductor device with channels formed at a hybrid Cu—Cu bonded interface is provided. The method includes forming one or more interconnects on a first die, and forming a passivation layer on the first die, wherein the passivation layer covers at least part of the one or more interconnects. The method continues by revealing at least part of each of the one or more interconnects, wherein the at least part of each of the one or more interconnects is exposed through the passivation layer, and forming one or more trenches in the passivation layer, wherein the one or more trenches are formed in respective spaces between the at least part of each of the one or more interconnects that are exposed. The method further includes forming one or more channels from the one or more trenches at a hybrid copper-to-copper bonded interface of the first die, wherein forming the one or more channels includes bonding, via hybrid copper-to-copper bonding, the at least part of the one or more interconnects that is exposed and the passivation layer to a second die.

In the following description, for the purposes of explanation, numerous details are set forth to provide a thorough understanding of the described embodiments. It will be apparent to one skilled in the art, however, that other embodiments may be practiced without some of these details. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

When an element is referred to herein as being “connected” or “coupled” to another element, it is to be understood that the elements can be directly connected to the other element, or have intervening elements present between the elements. In contrast, when an element is referred to as being “directly connected” or “directly coupled” to another element, it should be understood that no intervening elements are present in the “direct” connection between the elements. However, the existence of a direct connection does not exclude other connections, in which intervening elements may be present.

When an element is referred to herein as being “disposed” in some manner relative to another element (e.g., disposed on, disposed between, disposed under, disposed adjacent to, or disposed in some other relative manner), it is to be understood that the elements can be directly disposed relative to the other element (e.g., disposed directly on another element), or have intervening elements present between the elements. In contrast, when an element is referred to as being “disposed directly” relative to another element, it should be understood that no intervening elements are present in the “direct” example. However, the existence of a direct disposition does not exclude other examples in which intervening elements may be present.

Similarly, when an element is referred to herein as being “bonded” to another element, it is to be understood that the elements can be directly bonded to the other element (without any intervening elements) or have intervening elements present between the bonded elements. In contrast, when an element is referred to as being “directly bonded” to another element, it should be understood that no intervening elements are present in the “direct” bond between the elements. However, the existence of direct bonding does not exclude other forms of bonding, in which intervening elements may be present.

Likewise, when an element is referred to herein as being a “layer,” it is to be understood that the layer can be a single layer or include multiple layers. For example, a conductive layer may comprise multiple different conductive materials or multiple layers of different conductive materials, and a dielectric layer may comprise multiple dielectric materials or multiple layers of dielectric materials. When a layer is described as being coupled or connected to another layer, it is to be understood that the coupled or connected layers may include intervening elements present between the coupled or connected layers. In contrast, when a layer is referred to as being “directly” connected or coupled to another layer, it should be understood that no intervening elements are present between the layers. However, the existence of directly coupled or connected layers does not exclude other connections in which intervening elements may be present.

Moreover, the terms left, right, front, back, top, bottom, forward, reverse, clockwise and counterclockwise are used for purposes of explanation only and are not limited to any fixed direction or orientation. Rather, they are used merely to indicate relative locations and/or directions between various parts of an object and/or components.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth should be understood as being modified in all instances by the term “about.” In this application, the use of the singular includes the plural unless specifically stated otherwise, and use of the terms “and” and “or” means “and/or” unless otherwise indicated. Moreover, the use of the terms “including” and “having,” as well as other forms, such as “includes,” “included,” “has,” “have,” and “had,” should be considered non-exclusive. Also, terms such as “element” or “component” encompass both elements and components comprising one unit and elements and components that comprise more than one unit, unless specifically stated otherwise.

As used herein, the phrase “at least one of” preceding a series of items, with the term “and” or “or” to separate any of the items, modifies the list as a whole, rather than each member of the list (i.e., each item). The phrase “at least one of” does not require selection of at least one of each item listed; rather, the phrase allows a meaning that includes at least one of any one of the items, and/or at least one of any combination of the items. By way of example, the phrases “at least one of A, B, and C” or “at least one of A, B, or C” each refer to only A, only B, or only C; and/or any combination of A, B, and C. In instances where it is intended that a selection be of “at least one of each of A, B, and C,” or alternatively, “at least one of A, at least one of B, and at least one of C,” it is expressly described as such.

Hybrid Cu—Cu bonding is a technique that has allowed higher density/finer pitch interconnects to be used. Hybrid Cu—Cu bonding is a process combining dielectric bonding with the Cu—Cu bonding of interconnects. Thus, the respective interconnects (e.g., conductive wires, traces, microbumps, pads) may be bonded during the annealing process, while the dielectric material of the passivation layers can be bonded at ambient temperature. This technique has been used for die-to-wafer and die-to-die applications, such as in three-dimensional (3D) stacked die packages. Due to the proximity of active devices when utilizing hybrid Cu—Cu bonding, heat at the hybrid Cu—Cu bond interface (e.g., hybrid bonded interface) can become problematic.

The proposed semiconductor device with microfluidic channels at the hybrid bonded interface provide a way for heat to be transferred away from the hybrid bonded interface using a heat transfer material, such as a heat transfer fluid and/or a high thermal conductivity material. In this way, heat in hybrid Cu—Cu bonded semiconductor packages, and particularly at the hybrid bonded interface, may be mitigated.

FIG. 1 is a schematic diagram of a cross-section of a die 100 with a passivation layer and interconnects, in accordance with various embodiments. The die 100 includes a conductive layer 105, active layer 110, one or more interconnects 115*a*-115*m*, and one or more passivation layer filled gaps 120*a*-120*n* (collectively, the passivation layer 120). It should be noted that the various components of the die 100 are schematically illustrated in FIG. 1, and that modifications to the various components and other arrangements of die 100 may be possible and in accordance with the various embodiments.

In various embodiments, the die 100 may be a semiconductor die as known in the art. The die 100 may include, in the active layer 110, a piece of semiconducting material on which an active circuit is formed. The die 100, and specifically the active layer 110 of the die 100, may be formed of a semiconducting material, such as, without limitation, silicon (Si), including silicon oxide ($SiO_2$, $Si_3N_4$, and other Si compounds) or other semiconducting material (such as GaAs, etc.). In some examples, the active layer 110 includes an active device of the die 100. As known to those skilled in the art, an active device may refer to active circuits and/or components (e.g., transistors, etc.), as opposed to passive circuits and/or components (e.g., filters, etc.).

In various examples, the die 100 is part of a semiconductor device in which channels are formed at a hybrid Cu—Cu bonded interface of the die 100. Thus, FIG. 1 may depict die 100 at a stage of the manufacturing process in which passivation layer 120 has been removed (e.g., via chemical and/or mechanical polishing) to expose the one or more interconnects 115*a*-115*m* through the passivation layer 120.

In some embodiments, a conductive layer 105 may be formed over the active layer 110. In various examples, the conductive layer 105 may be formed via a metal plating and/or a deposition process. Accordingly, in some examples, the active layer 110 may act as a substrate for the conductive layer 105. The conductive layer 105, in some examples, includes a metallization layer electrically coupled to an active device of the active layer 110. The conductive layer 105 may, accordingly, be formed from a conductive material, such as, without limitation, Cu or other metal. In some examples, the conductive layer 105 may form conductive structures, such as the one or more interconnects 115*a*-115*m*. The one or more interconnects 115*a*-115*m* may include one or more of conductive wire, trace, microbumps, and/or pads made of a conductive material (such as Cu). As used herein, bumps and/or microbumps may refer to copper microbumps. Microbumps, for example, may include copper pillars (CuP) having solder tips and/or solder caps. In some examples, the one or more interconnects 115*a*-115*m* form CuPs on which solder tips may be formed. Accordingly, the one or more interconnects 115*a*-115*m* may include any structures electrically coupling different parts of the active layer 110, as specifically different parts of the active device, such as circuit elements or other components, to other components (such as another die or other off-die components).

In various examples, the one or more interconnects 115*a*-115*m* may be arranged such that one or more respective gaps are present between adjacent interconnects of the one or more interconnects 115*a*-115*m*. In some examples, the one or more interconnects 115*a*-115*m* may be arranged to form an array of interconnects (e.g., an array of microbumps and/or pads). The array of interconnects may be configured to be bonded, for example via hybrid copper-to-copper bonding, to another die or substrate. Accordingly, the one or more interconnects 115*a*-115*m* may form at least part of a bonding interface of the die 100.

In some examples, a passivation layer 120 may be deposited over the conductive layer 105, and the one or more interconnects 115*a*-115*m* may, at least in part, be revealed through the passivation layer 120. In some examples, a chemical-mechanical polishing (CMP) process may be utilized to remove part of the passivation layer 120 to expose the one or more interconnects 115*a*-115*m* of the conductive layer 105. Accordingly, exposing the one or more interconnects 115*a*-115*m* includes any process by which at least part of the one or more interconnects 115*a*-115*m* is physically exposed through the passivation layer 120 to an exterior environment, or otherwise made accessible physically and/or electrically from outside of the dielectric material of the passivation layer 120. Once exposed, the respective gaps between the adjacent interconnects of the one or more interconnects may remain filled by the passivation layer 120. Accordingly, in various embodiments, the die 100 may further include one or more passivation layer filled gaps 120*a*-120*n*, in which the dielectric material of the passivation layer 120 is disposed in the areas (e.g., gaps filled with dielectric material) between adjacent interconnects of the one or more interconnects 115*a*-115*m*.

In various examples, the passivation layer 120 is formed of a dielectric material. In some examples, the dielectric material may include, without limitation, one or more of an epoxy material, polymer material (e.g., polyimides (PI), polybenzoxazoles (PBO), etc.), silicon-based (including $SiO_2$, $Si_3N_4$, and other silicon compounds), an organic compound, or other suitable dielectric material. Thus, in various examples, the passivation layer 120 may be deposited or otherwise formed over the conductive layer 105.

Figure 2:
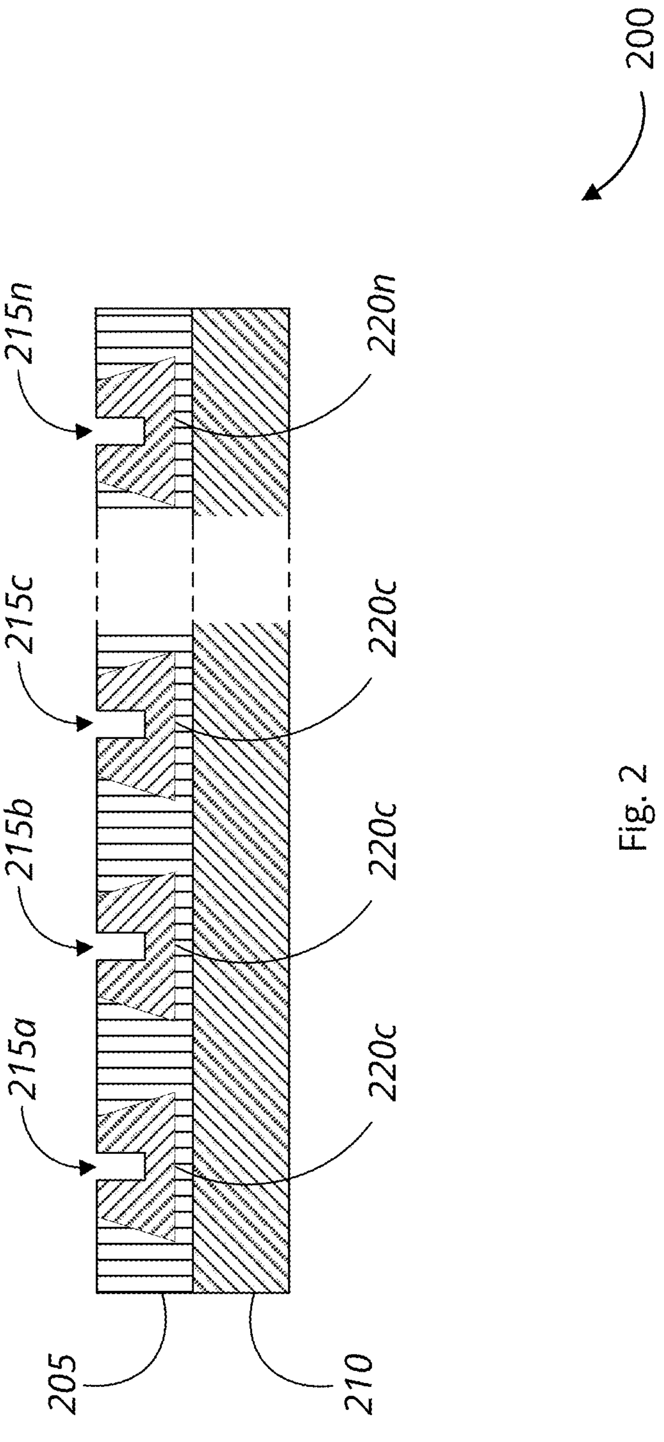
FIG. 2 is a schematic diagram of a cross-section of a die with a passivation layer having trenches, in accordance with various embodiments.

FIG. 2 is a schematic diagram of a cross-section of a die with a passivation layer having trenches, in accordance with various embodiments. The die 200 includes a conductive layer 205, active layer 210, one or more trenches 215*a*-215*n*, and one or more passivation layer filled gaps 220*a*-220*n* (collectively, the passivation layer 220). It should be noted that the various components of the die 200 are schematically illustrated in FIG. 2, and that modifications to the various components and other arrangements of the die 200 may be possible and in accordance with the various embodiments.

As in FIG. 1, FIG. 2 depicts die 200 that is part of a semiconductor device in which channels are formed at a hybrid Cu—Cu bonded interface of the die 200. FIG. 2 depicts the die 200 at a stage of the manufacturing process in which one or more trenches 215*a*-215*n* are formed within the passivation layer filled gaps 220*a*-220*n*, respectively. Accordingly, as used herein, a trench refers to a structure formed by removal of material, in this example, removal of dielectric material from a passivation layer 220, without passing completely through the passivation layer 220. For example, a trench is formed by removal of some dielectric material of a passivation layer 220 without going through the entire passivation layer to, in this example, the underlying conductive layer 205. dielectric material). In some examples, a trench may be formed via an etching or drilling process. The trench may be a depression (e.g., a groove) formed into the passivation layer 220 that is open, for example, at a top surface. Accordingly, the trench may have side walls (e.g., faces) and a bottom (e.g., a base). The trench may be formed to have different cross-sectional shapes (e.g., a transverse cross-section looking longitudinally through the trench) and embodiments are not limited to a particular shape or arrangement. In the examples depicted, the one or more trenches 215*a*-215 have a “stripe-shape,” with side walls orthogonal to a flat base. In other embodiments, the trench may have a different shape, such as a triangular shape (forming a pointed base).

In various embodiments, the one or more trenches 215*a*-215*n* may be formed within the passivation layer 220, and specifically within the one or more passivation layer filled gaps 220*a*-220*n*. The one or more trenches 215*a*-215*n* may be formed using various processes. For example, formation of the one or more trenches 215*a*-215*n* may include, without limitation, drilling (e.g., laser drilling) and/or etching respective trenches of the one or more trenches 215*a*-215*n*.

In some examples, the one or more trenches 215*a*-215*n* may be part of a first set of trenches, in which the one or more trenches 215*a*-215*n* extend longitudinally in the same direction, in this example into the page. Accordingly, in some examples, the one or more trenches 215*a*-215*n* may be arranged so that they do not intersect with each other. In some further examples, the die 200 includes one or more additional sets of trenches (not shown), which run in a different direction from the first set of trenches. For example, in some embodiments, the one or more trenches 215*a*-215*n* may be intersected by the additional set of trenches. In some examples, the additional set of trenches may be orthogonal to the one or more trenches 215*a*-215*n*. In yet further embodiments, the one or more trenches 215*a*-215*n* may form part of a grid of trenches (e.g., formed by a plurality of trenches including the one or more trenches 215*a*-215*n*). Accordingly, in various examples, each trench of the one or more trenches 215*a*-215*n* is respectively formed adjacent to at least one of the one or more interconnects 220*a*-220*n*.

Although the one or more trenches 215*a*-215*n* are shown as being present in each respective passivation layer filled gap 220*a*-220*n*, that the one or more trenches are not limited to any one particular arrangement, and that in other embodiments, different arrangements of the one or more trenches 215*a*-215*n* are possible. For example, in some embodiments, the one or more trenches 215*a*-215*n* may be selectively formed (or not formed) in a respective passivation layer filled gap 220*a*-220*n*. In some examples, the one or more trenches 215*a*-215*n* may be formed according to a pattern (e.g., at every other passivation layer filled gap 220*a*-220*n*, etc.). In some examples, a given trench of the one or more trenches 215*a*-215*n* may traverse the entire span of the die 200 (e.g., the entire length, width, or other end-to-end measure of the die). In other words, the given trench continues along a respective direction from one end of the die 200 (e.g., a proximal end) to another end of the die 200 (e.g., a distal end). In other examples, a given trench of the one or more trenches 215*a*-215*n* may not traverse the entire span of the die 200, and may terminate and/or change directions (e.g., curve or otherwise turn in a different direction before reaching the other end of the die from where the given trench begins).

Accordingly, in various examples, the one or more trenches 215*a*-215*n* may be arranged and formed at a desired spacing, location, orientation, and shape. In some examples, the one or more trenches 215*a*-215*n* may be arranged according to a cooling loop and/or path design (e.g., the grid of trenches, S-shaped or Z-shaped pattern, etc.).

In some further embodiments, the one or more trenches 215*a*-215*n* may be filled with a buffer material for later removal. In some examples, the buffer material may be deposited into the trenches, and configured to provide structural support. The buffer material may include material configured to be removed chemically and/or mechanically after the die 200 has been bonded to another die and/or substrate. Thus, the one or more trenches 215*a*-215*n* may, after bonding, form one or more channels. In contrast with a trench, channels are longitudinal structures that form an enclosed volume (e.g., enclosed at a top surface of the die 200 and/or enclosed over the top of the one or more trenches 215*a*-215*n*), and may be configured to hold a heat transfer material as will be described in greater detail below. In some examples, the buffer material may be configured to be removed from within the respective one or more channels. Buffer materials may include, without limitation, and epoxy and/or polymer material. In various examples, the buffer material is a material that is different from the passivation layer.

Figure 3:
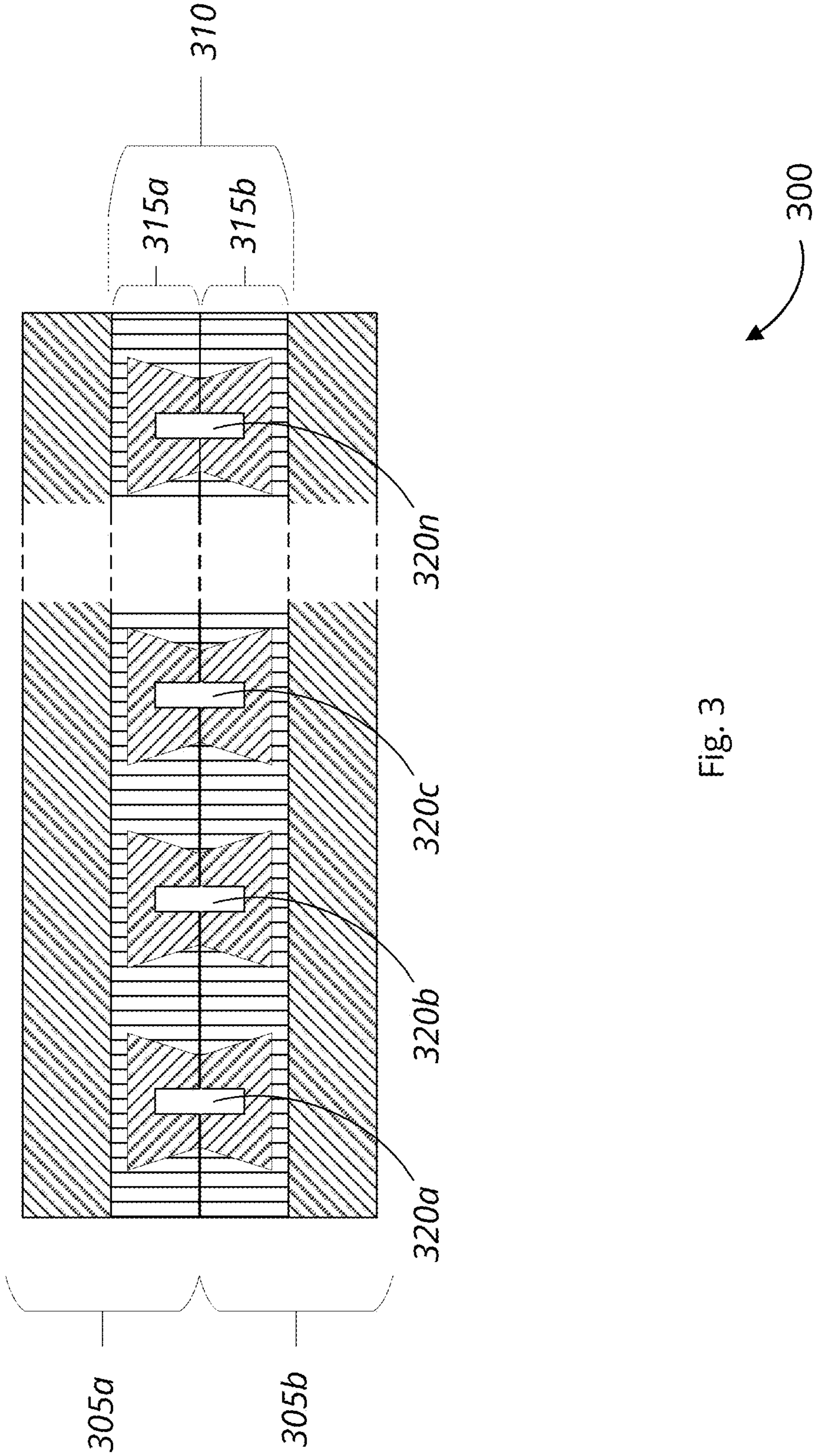
FIG. 3 is a schematic diagram of a cross-section of semiconductor device with one or more channels at a hybrid Cu—Cu bonded interface, in accordance with various embodiments.

Once the one or more trenches 215*a*-215*n* have been formed, the die 200 may be bonded to another die to form a semiconductor device having one or more channels at a bonding interface (e.g., a hybrid Cu—Cu bonded interface), as depicted in FIG. 3.

FIG. 3 is a schematic diagram of a cross-section of semiconductor device 300 with one or more channels at a hybrid Cu—Cu bonded interface, in accordance with various embodiments. The semiconductor device 300 includes a first die 305*a* having a first die interface 315*a*, second die 305*b* having a second die interface 315*b*, hybrid bonded interface 310, and one or more channels 320*a*-320*n*. It should be noted that the various components of semiconductor device 300 are schematically illustrated in FIG. 3, and that modifications to the various components and other arrangements of semiconductor device 300 may be possible and in accordance with the various embodiments.

FIG. 3 depicts the semiconductor device 300 after the first die 305*a* and second die 305*b* have been bonded. Accordingly, as previously described with respect to FIGS. 1 & 2, the first die 305*a* and second die 305*b* may each include respective bonding interfaces (e.g., first bonding interface 315*a* and second bonding interface 315*b*), which further include respective interconnects, passivation layers and filled gaps, and trenches in the respective filled gaps. When bonded together, the first bonding interface 315*a* and second bonding interface 315*b* may together form the hybrid bonded interface 310. In various embodiments, when the first and second dies 305*a*, 305*b* are bonded (e.g., via hybrid Cu—Cu bonding), one or more channels 320*a*-320*n* are formed by the respective trenches of the first and second dies 305*a*, 305*b* in the hybrid bonded interface 310. The hybrid bonded interface 310 may include an interface in which copper elements (e.g., the one or more interconnects of the respective bonding interfaces 315*a*, 315*b*) are bonded via a Cu—Cu bonding process, in combination with dielectric elements (e.g., the respective passivation layers of the respective bonding interfaces 315*a*, 315*b*) that are bonded using a dielectric-to-dielectric bonding process. Thus, the hybrid bonded interface 310 is an interface between dies 305*a*, 305*b* that includes both copper-to-copper bonds and dielectric-to-dielectric bonds.

In various examples, the first die 305*a* and second die 305*b* have a planar structure, in which the first and second dies 305*a*, 305*b* are bonded to each other. In further examples, the first and second dies 305*a*, 305*b* may be coupled to additional dies, for example, above the first die 305*a* and/or below the second die 305*b*. In some examples, the semiconductor device 300 may include a 3D stacked die package which is at least partially formed by the first and second dies 305*a*, 305*b*. Although the first and second dies 305*a*, 305*b* are depicted as being coupled to another die (e.g., bonded to each other), it is to be understood that in other embodiments, the first die 305*a* may instead or additionally be coupled to a substrate such as an interposer, wafer, or circuit board (e.g., a printed circuit board (PCB)).

In various examples, the first and second dies 305*a*, 305*b* are bonded via hybrid Cu—Cu bonding. As previously described, hybrid Cu—Cu bonding is a process by which the respective interconnects are Cu—Cu bonded in combination with dielectric bonding (e.g., bonding of the respective passivation layers). Thus, the respective interconnects (e.g., conductive wires, traces, microbumps, pads) may be bonded during the annealing process, while the dielectric material of the passivation layers can be bonded at ambient temperature.

In some examples, after bonding of the first and second dies 305*a*, 305*b* (or a single die of the first and second dies 305*a*, 305*b* to a substrate), where a buffer material was deposited in the respective trenches of the first die 305*a* and/or second die 305*b*, the buffer material may be removed from within the respectively formed one or more channels 320*a*-320*n*. As previously described, removal of the buffer material may include mechanical (e.g., drilling) and/or chemical removal.

In various embodiments, the one or more channels 320*a*-320*n* may further be at least partially filled with a heat transfer material. According to some examples, the heat transfer material is configured to carry away heat from the hybrid bonded interface 310. In some examples, the heat transfer material may be a heat transfer fluid. Accordingly, heat may be carried away from the hybrid bonded interface 310 by circulation of a heat transfer fluid within the one or more channels 320*a*-320*n* (e.g., microfluidic channels). Suitable heat transfer fluids may include gases and/or liquids, such as, without limitation, water, oils, and glycol-based fluids. In some examples, the heat transfer fluid may be circulated passively (e.g., by temperature differential). In other examples, the heat transfer fluid may be circulated via a pump (e.g., a microfluidic pump). Accordingly, in some examples, the semiconductor device 300 may further include a fluid interface (not shown), such as, without limitation, a nozzle, pipe, tube, or other coupler. Moreover, the semiconductor device 300 may further be configured to be coupled to pump and/or reservoir, as described in greater detail below with respect to FIGS. 5 & 6.

In further examples, the heat transfer material may be a material with high thermal conductivity. Suitable heat transfer materials may include, without limitation, carbon nanotubes and/or graphene. In yet further embodiments, the thermal transfer material may be a structure disposed within the one or more channels 320*a*-320*n*, such as a heat pipe.

With formation of the trenches in the respective passivation layers of the first and second dies 305*a*, 305*b*, which are further respectively formed directly over the respective interconnects/metallization layer, which is in turn formed directly over respective active layers (e.g., active devices of the first and second dies 305*a*, 305*b*), the positioning of the one or more channels 320*a*-320*n*, within the hybrid bonded interface 310, allows heat transfer material to be brought in relatively closer proximity to the respective active devices of the dies 305*a*, 305*b* than is possible with traditional cooling solutions, in which cooling is conducted external to the hybrid bonded interface 310.

Figure 4:
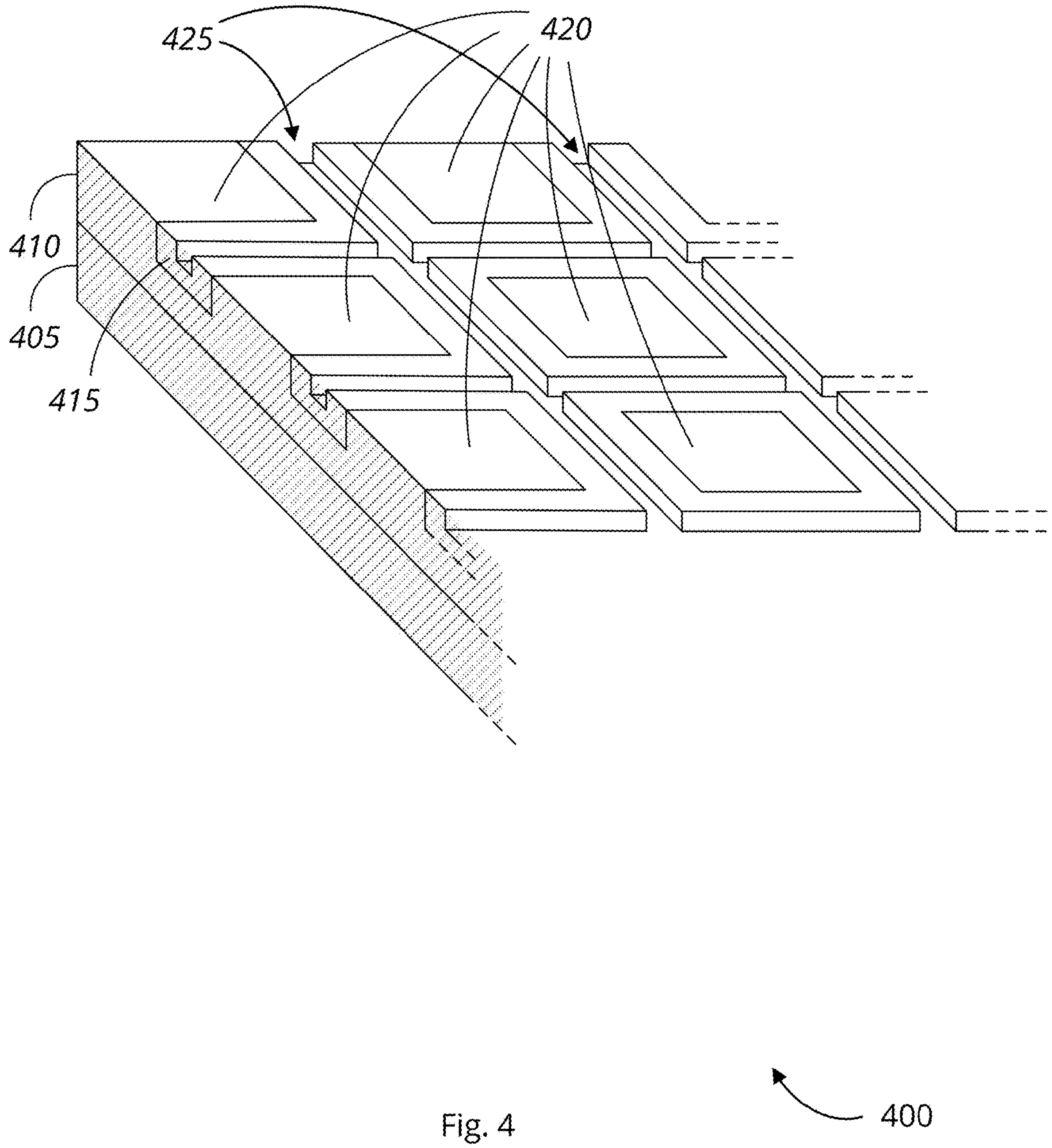
FIG. 4 is a schematic perspective view of a die with a passivation layer having trenches, in accordance with various embodiments.

FIG. 4 is a schematic perspective view of a die 400 with a passivation layer having trenches, in accordance with various embodiments. The die 400 includes a conductive layer 405, active layer 410, passivation layer 415, a plurality of interconnects 420, and plurality of trenches 425. It should be noted that the various components of die 400 are schematically illustrated in FIG. 4, and that modifications to the various components and other arrangements of die 400 may be possible and in accordance with the various embodiments.

As previously described with respect to FIGS. 1 & 2, the die 400 may include a plurality of trenches 425 formed in respective gaps filled by the passivation layer 415. In the example depicted, a first set of trenches of the plurality of trenches 425 may extend in a first direction (e.g., front to back), in the areas (e.g., gaps) between respective interconnects of the plurality of interconnects 420. A second set of trenches may extend in a second direction (e.g., left to right), in the gaps between respective interconnects of the plurality of interconnects 420. Thus, as previously described, the plurality of trenches 425 may be arranged to form a grid pattern around the plurality of interconnects 420, with respective trenches disposed between at least two adjacent interconnects of the plurality of interconnects 420.

It is to be understood that in other examples, different patterns and arrangements of the plurality of trenches 425 may be utilized, and embodiments are not limited to any single arrangement of the plurality of trenches 425.

Figure 5:
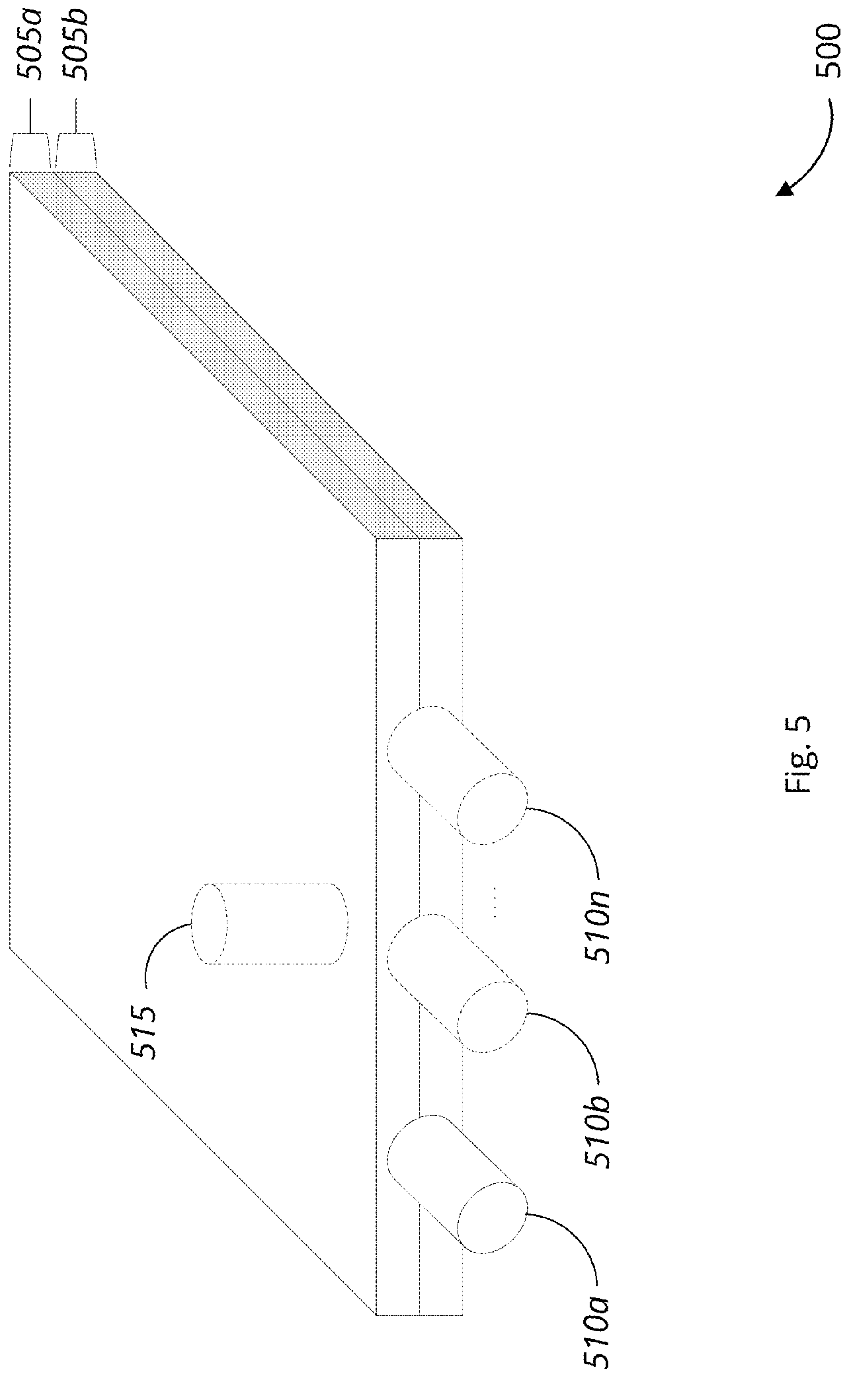
FIG. 5 is a schematic perspective view of a semiconductor device with one or more channels at a hybrid Cu—Cu bonded interface, in accordance with various embodiments.

FIG. 5 is a schematic perspective view of a semiconductor device 500 with one or more channels at a hybrid Cu—Cu bonded interface, in accordance with various embodiments. The semiconductor device 500 includes a first die 505*a*, second die 505*b*, and one or more fluid interfaces 510*a*-510*n*, 515. It should be noted that the various components of semiconductor device 500 are schematically illustrated in FIG. 5, and that modifications to the various components and other arrangements of semiconductor device 500 may be possible and in accordance with the various embodiments.

As previously described with respect to FIG. 3, the semiconductor device 500 may include one or more channels formed at a hybrid bonded interface where the first bonding interface of the first die 505*a* and second bonding interface of the second die 505*b* are bonded. The one or more channels may further be coupled to the one or more fluid interfaces 510*a*-510*n*, 515. In various examples, the one or more fluid interfaces 510*a*-510*n*, 515 may be in fluid communication with the one or more channels, and configured to allow fluid to be introduced into and/or be removed from the one or more channels.

In some examples, the one or more fluid interfaces 510*a*-510*n* may be arranged along a side wall of the semiconductor device 500. Alternatively, in some examples, a fluid interface may be arranged along a top or bottom surface of the semiconductor device, such as with fluid interface 515.

In various examples, the one or more fluid interfaces 510*a*-510*n* may be configured to allow fluid to be carried into and out of the semiconductor device 500 from an external source, such as a pump and/or reservoir. Accordingly, the one or more fluid interfaces 510*a*-510*n*, 515 may further be configured to be coupled to the pump and/or reservoir. In some examples, the one or more fluid interfaces 510*a*-510*n*, 515 may be coupled to the pump and/or reservoir via hoses. Accordingly, in some examples, the one or more fluid interfaces 510*a*-510*n*, 515 may include, without limitation, nozzles (e.g., microfluidic nozzle), pipes, membranes, or valves.

Figure 6:
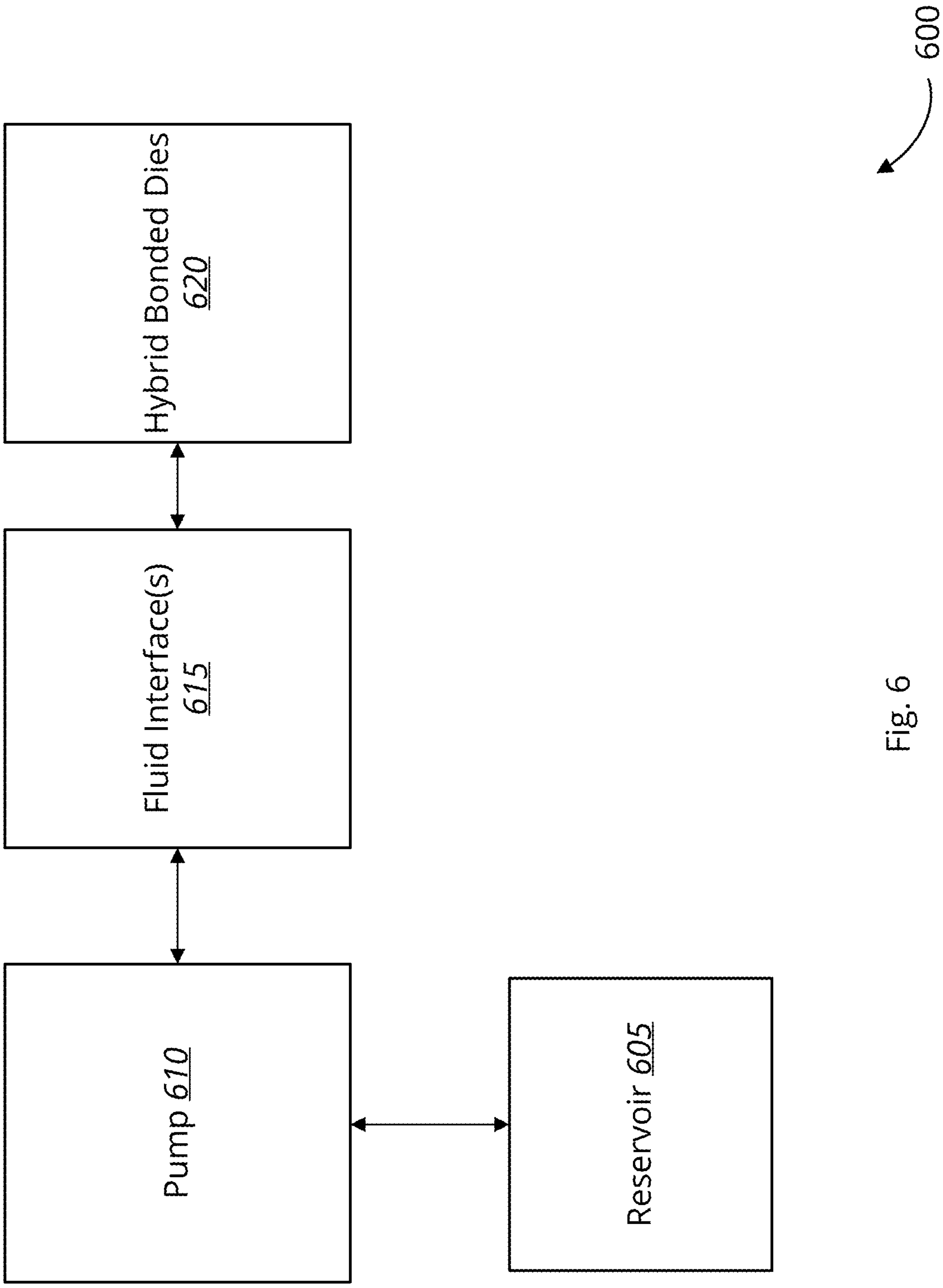
FIG. 6 is a block diagram of a system for a semiconductor device with one or more channels at a hybrid Cu—Cu bonded interfaces, in accordance with various embodiments.

FIG. 6 is a block diagram of a system 600 for a semiconductor device with one or more channels at a hybrid Cu—Cu bonded interfaces, in accordance with various embodiments. The system 600 includes a reservoir 605, pump 610, one or more fluid interfaces 615, and hybrid bonded dies 620. It should be noted that the various components of system 600 are schematically illustrated in FIG. 6, and that modifications to the various components and other arrangements of system 600 may be possible and in accordance with the various embodiments.

In various embodiments, a reservoir 605 may be configured to hold a heat transfer fluid, as previously described. The reservoir 605 may be coupled to a pump 610, configured to pump, via the one or more fluid interfaces 615, the heat transfer fluid to the one or more channels of hybrid bonded dies 620, and from the one or more channels of the hybrid bonded dies 620 to the reservoir 605. The pump 610 may include microfluidic pumps, such as, without limitation, syringe-type pumps and/or peristaltic pumps.

In other embodiments, the system 600 may not include a pump, and heat transfer fluid may passively circulate between the reservoir 605 and the one or more channels of the hybrid bonded dies 620 by temperature differentials of the heat transfer fluid within the one or more channels of the hybrid bonded dies 620, and between other parts of the system 600.

In yet further embodiments, heat transfer fluid in the reservoir 605 may be cooled. In some examples, cooling may occur passively within the reservoir 605. In other embodiments, the heat transfer fluid may be cooled actively, for example, via a thermoelectric cooler (e.g., Peltier device), heat pump, or other cooling device as known to those skilled in the art.

Figure 7:
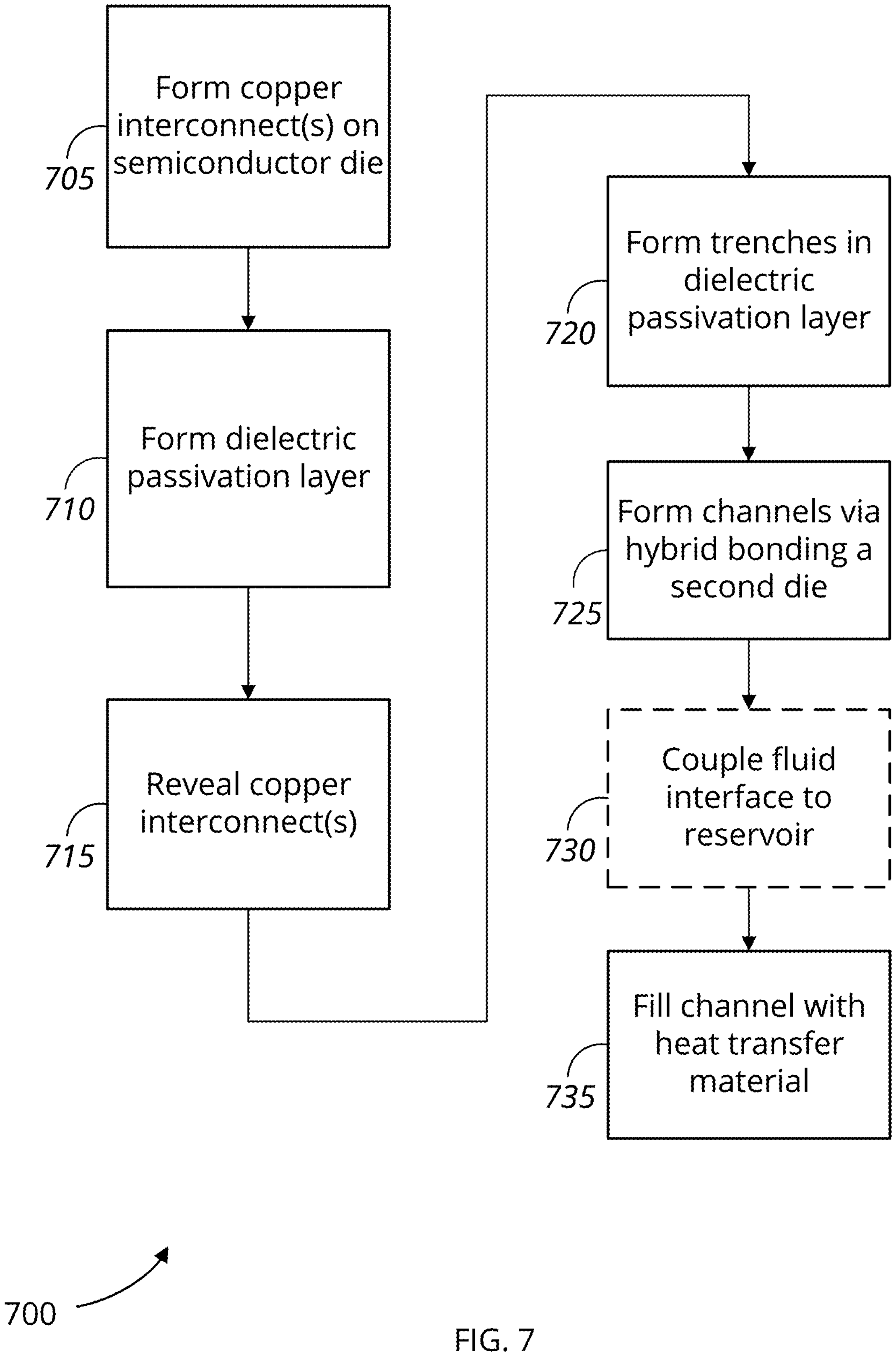
FIG. 7 is a flow diagram of a method of manufacturing semiconductor device with one or more channels at a hybrid Cu—Cu bonded interface, in accordance with various embodiments.

FIG. 7 is a flow diagram of a method 700 of manufacturing semiconductor device with one or more channels at a hybrid Cu—Cu bonded interface. The method 700 includes, at block 705, forming one or more interconnects on a semiconductor die. As previously described, the one or more interconnects may include conductive interconnects, such as copper interconnects. Thus, in some examples, the one or more interconnects on the semiconductor die may include forming a metallization layer on the semiconductor die, the metallization layer comprising conductive structures which form the one or more interconnects. In various embodiments, the one or more interconnects may be electrically and/or physically coupled to an active layer of the semiconductor die. Forming the one or more interconnects may include, without limitation, metal plating and/or deposition of a metallization layer on the semiconductor die.

The method 700 continues, at block 710, by forming a passivation layer on top of the one or more interconnects. As previously described, the passivation layer may be a dielectric passivation layer (e.g., formed from a dielectric material). Forming the passivation layer may include depositing, over the metallization layer, including the one or more interconnects, the dielectric material of the passivation layer.

The method 700 continues, at block 715, by revealing, at least in part, the one or more interconnects covered by the passivation layer. In some examples, revealing the one or more interconnects includes a CMP process by which part of the passivation layer is removed to expose the one or more interconnects. In further examples, revealing the one or more interconnects may include cutting, grinding, or chemical and/or mechanical process by which the passivation layer may be removed to reveal at least part of the one or more interconnects. Accordingly, revealing the one or more interconnects may include any process by which at least part of the one or more interconnects is exposed to an external environment, or otherwise made accessible physically and/or electrically, from outside of the passivation layer.

The method 700 may further include, at block 720, forming trenches in the passivation layer. Once the one or more interconnects are exposed, respective gaps between the adjacent interconnects of the one or more interconnects may remain filled by the dielectric material of the passivation layer. Accordingly, in various embodiments, trenches may be formed in the passivation layer in the areas between the one or more interconnects. In various examples, one or more trenches may be formed in the passivation layer via chemical and/or mechanical processes such as, without limitation, drilling (e.g., laser drilling) and/or etching.

In some further embodiments, the one or more trenches may be filled with a buffer material for later removal. In some examples, the buffer material may be deposited into the trenches, and configured to provide structural support. The buffer material may include material configured to be removed chemically and/or mechanically after the die has been bonded to another die and/or substrate.

The method 700 continues, at block 725, by forming one or more channels by hybrid bonding the first die to a second die, or alternatively, to a substrate. When bonded together, the interconnects and passivation layer (including trenches) together form a hybrid bonded interface. In various embodiments, when the first and second dies are bonded (e.g., via hybrid Cu—Cu bonding), one or more channels may be formed by the respective trenches of the first and second dies. In some examples, where a buffer material was deposited in the respective trenches of the first die and/or second die, the buffer material may be removed from within the respectively formed one or more channels. As previously described, removal of the buffer material may include mechanical (e.g., drilling) and/or chemical removal.

At block 730, the method 700 continues by coupling a fluid interface, in fluid communication with the one or more channels, to a reservoir. In various embodiments, a heat transfer material may be circulated in the one or more channels, such as a heat transfer material may be a heat transfer fluid. Accordingly, in some examples, a fluid interface may be coupled to the one or more channels formed at the hybrid bonded interface. The fluid interface may include, without limitation, a nozzle, pipe, tube, or other coupler. In some examples, the heat transfer fluid may be circulated passively (e.g., by temperature differential) to the reservoir. In other examples, the heat transfer fluid may be circulated via a pump (e.g., a microfluidic pump). Accordingly, in some examples, coupling the fluid interface to the reservoir may further include coupling the fluid interface to a pump.

At block 735, the method 700 further includes filling the one or more channels with a heat transfer material. In various embodiments, the heat transfer material is configured to carry away heat from the hybrid bonded interface via the one or more channels. As described above, in some examples, the heat transfer material may be a heat transfer fluid. Accordingly, heat may be carried away from the hybrid bonded interface by circulation of a heat transfer fluid within the one or more channels (e.g., microfluidic channels). As previously described, suitable heat transfer fluids may include gases and/or liquids, such as, without limitation, water, oils, and glycol-based fluids. In further examples, the heat transfer material may be a material with high thermal conductivity. Suitable heat transfer materials may include, without limitation, carbon nanotubes and/or graphene. In yet further embodiments, the thermal transfer material may be a structure disposed within the one or more channels, such as a heat pipe.

The techniques and processes described above with respect to various embodiments may be used to manufacture dies 100, 200, 400, and semiconductor devices 300, 500 and/or components thereof, as described herein.

While some features and aspects have been described with respect to the embodiments, one skilled in the art will recognize that numerous modifications are possible. For example, the methods and processes described herein may be implemented using hardware components, custom integrated circuits (ICs), programmable logic, and/or any combination thereof. Further, while various methods and processes described herein may be described with respect to particular structural and/or functional components for ease of description, methods provided by various embodiments are not limited to any particular structural and/or functional architecture but instead can be implemented in any suitable hardware configuration. Similarly, while some functionality is ascribed to one or more system components, unless the context dictates otherwise, this functionality can be distributed among various other system components in accordance with the several embodiments.

Moreover, while the procedures of the methods and processes described herein are described in a particular order for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various embodiments are described with or without some features for ease of description and to illustrate aspects of those embodiments, the various components and/or features described herein with respect to a particular embodiment can be substituted, added and/or subtracted from among other described embodiments, unless the context dictates otherwise. Consequently, although several embodiments are described above, it will be appreciated that the invention is intended to cover all modifications and equivalents within the scope of the following claims.

What is claimed is:

1. An apparatus comprising:

a die comprising an active device;

one or more interconnects coupled to the active device; and a passivation layer disposed in areas between adjacent interconnects of the one or more interconnects;

wherein the passivation layer includes one or more trenches, each trench of the one or more trenches respectively formed between at least two adjacent interconnects of the one or more interconnects, and longitudinally coextensive with the at least two adjacent interconnects of the one or more interconnects, the one or more trenches being positioned inside bonding interfaces to form one or more channels and sharing a hybrid-copper-to-copper bonding interface, the hybrid copper-to-copper bonding interface comprising an interface in which copper elements are bonded via a copper to copper bonding process.

2. The apparatus of claim 1, wherein the passivation layer comprises a silicon-based dielectric material.

3. The apparatus of claim 1, wherein the one or more trenches is filled with a buffer material, wherein the buffer material is configured to be removed from the one or more trenches after the die has been bonded to another die or substrate.

4. The apparatus of claim 3, wherein the buffer material comprises a polymer material.

5. The apparatus of claim 1, wherein the one or more interconnects are configured to form an array of interconnects configured to be bonded via hybrid copper-to-copper bonding to another die or substrate.

6. The apparatus of claim 1, wherein the one or more interconnects comprises one or more of a conductive wire, trace, or pad.

7. The apparatus of claim 1, wherein the one or more trenches comprises a first set of trenches extending longitudinally in a first direction.

8. The apparatus of claim 7, wherein the one or more trenches comprises a second set of trenches extending longitudinally in a second direction different from the first direction, wherein the first set of trenches and second set of trenches together form a grid of trenches in the passivation layer.

9. An apparatus comprising:

a die comprising an active device comprising a first bonding interface at a first region and a bonding interface at a second region;

one or more interconnects coupled to the active device; and a passivation layer disposed in areas between adjacent interconnects of the one or more interconnects;

a hybrid bonded interface comprising a first region and a second region, the first region being provided for a copper-to-copper interface, the second region being provided for a dielectric-to-dielectric interface;

wherein the passivation layer includes one or more trenches, each trench of the one or more trenches respectively formed between at least two adjacent interconnects of the one or more interconnects, and longitudinally coextensive with the at least two adjacent interconnects of the one or more interconnects, the one or more trenches being positioned inside bonding interfaces to form one or more channels.

* * * * *